United States Patent [19]

Mukerji

[11] Patent Number: 5,391,397
[45] Date of Patent: Feb. 21, 1995

[54] METHOD OF ADHESION TO A POLYIMIDE SURFACE BY FORMATION OF COVALENT BONDS

[75] Inventor: Prosanto K. Mukerji, Phoenix, Ariz.

[73] Assignee: Motorola, Inc., Schaumburg, Ill.

[21] Appl. No.: 223,184

[22] Filed: Apr. 5, 1994

[51] Int. Cl.$^6$ .............................................. B05D 5/10
[52] U.S. Cl. ................... 427/207.1; 427/412.1; 427/430.1; 428/473.5
[58] Field of Search .............. 427/430.1, 407.1, 412.1, 427/337, 207.1, 208.4; 428/473.5

[56] References Cited

U.S. PATENT DOCUMENTS 4,276,186 6/1981 Bakos et al. .......................... 252/158
5,326,643 7/1994 Adamopoulos et al. ......... 428/472.2

*Primary Examiner*—Shrive Beck
*Assistant Examiner*—Erma Cameron
*Attorney, Agent, or Firm*—Robert D. Atkins

[57] ABSTRACT

A polyimide surface (18) of a semiconductor device (12) is pretreat the polyimide layer with a hydroxyl amine solution at an elevated temperature to generate functional groups that react with an underfill encapsulant (16) to form covalent bonds between the polyimide layer and the encapsulant material between the semiconductor device and a substrate (10). The hydroxyl amine solution include a reagent such as 2,(2-aminoethoxy) ethanol dissolved in a solvent like N-methyl pyrolidione at 65° C. for sixty seconds. The hydroxyl amine solution may be sprayed onto the polyimide layer, or deposited by vapor deposition. The semiconductor die with the treated polyimide layer is attached to the substrate by standard DCA methods leaving a gap between the assemblies. The encapsulant is introduced between the semiconductor die and the substrate and cured to form a covalent bond with the polyimide layer and an environmental seal between the assemblies resulting in enhanced adhesion.

16 Claims, 1 Drawing Sheet

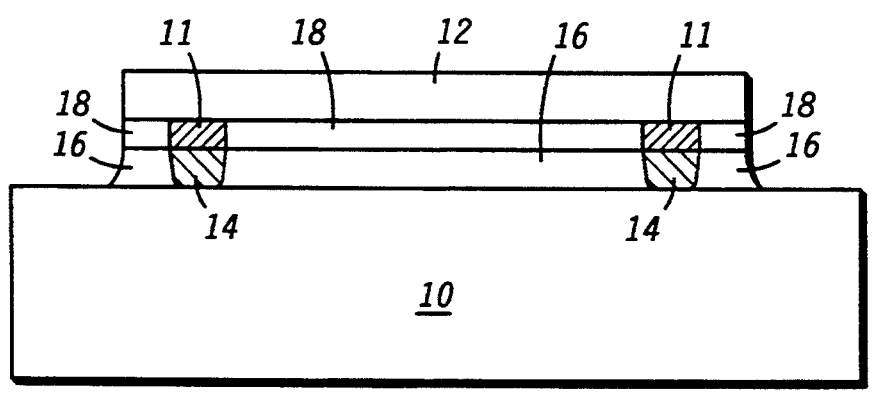

METHOD OF ADHESION TO A POLYIMIDE SURFACE BY FORMATION OF COVALENT BONDS

BACKGROUND OF THE INVENTION

The present invention relates in general to semiconductor devices and, more particularly, to adhesion to a polyimide surface by formation of covalent bonds.

Semiconductor devices are widely used in many products. An important feature of semiconductor devices is the small size of the semiconductor device and any associated module housing. As the products using semiconductor devices grow smaller, it is important to keep the dimensions of the semiconductor devices and module housing as small as possible. However, competing with this need for smaller dimensions is the increasing need for functionality that the consumers of semiconductor devices demand. The increase in functionality tends to increase the size and complexity of the semiconductor devices and the number of semiconductor devices per module.

Another significant factor is maintaining a low cost of manufacturing despite the increase in semiconductor device complexity and density. One significant cost in manufacturing a semiconductor device is the lead frame. Often, customized lead frames must be manufactured for each type of semiconductor device which is costly and time consuming. As a result, direct chip attach (DCA) type assemblies are gaining in popularity. In DCA, the semiconductor device is directly attached to a substrate, for example, a printed circuit board (PCB). DCA involves directly coupling the pads of a semiconductor device, without a lead frame, to matching contacts on the PCB. Thus the cost and size of an individual package for the semiconductor device is eliminated.

DCA is facilitated by fabricating raised metal bumps on semiconductor device pads, and mounting the device, bumps down, onto the PCB or other type of substrate. In order to protect the interconnections between the substrate and the semiconductor device from fatiguing during thermal cycling, and to environmentally protect the semiconductor device itself, a dielectric material is often applied between the semiconductor device and substrate. The dielectric material is usually a polymer, typically an epoxy resin, that forms a bond to the semiconductor device, the interconnections and the substrate.

In the prior art, when the surface passivation of the semiconductor device and/or the substrate is polyimide, adhesion of any polymer encapsulant to the polyimide surface has shown a tendency to separate during thermal cycling. Although chemical coupling agents, mechanical roughing and plasma etching have been attempted to improve the bonding, the adhesion problem continues to lead to premature separation and failure of the semiconductor device or interconnection fatigue failure.

Hence, a need exists for improved adhesion to polyimide surfaces.

BRIEF DESCRIPTION OF THE DRAWING

The sole FIGURE illustrates semiconductor device bonded to a substrate.

DETAILED DESCRIPTION OF THE PREFERRED EMBODIMENT

Referring to the sole figure, substrate 10 is shown as a platform for one or more semiconductor die attached by direct chip attach (DCA) techniques. Substrate 10 is typically made of ceramic or glass. Substrate 10 may also be a printed circuit board, e.g. FR4 PCB variety. Semiconductor die 12 includes metal interconnects 14 as raised metal bumps formed on pads 11 of semiconductor die 12. Interconnects 14 are formed with solder, or other material that reflows to make electrical interconnects to substrate 10. Semiconductor die 12 is attached to substrate 10 by bonding interconnects 14 to matching pads on substrate 10. The method of attachment depends on the material of interconnects 14, for example, solder-type interconnects 14 reflow at 215° C. for fifteen seconds to form the electrical connections between semiconductor die 12 and substrate 10. One or more semiconductor die like 12 attach to substrate 10 and interconnect as per a specific application to form a functional module.

An underfill encapsulant 16 is introduced between semiconductor die 12 and substrate 10 and cured to form a bond and an environmental seal between the assemblies. Encapsulant 16 is a dielectric formed with a polymer, such as an epoxy resin, up to say 100 microns in thickness. Encapsulant 16 may also be a non-epoxy such as silicon carbon resin (SYCAR). The bottom surface of semiconductor die 12 includes polyimide layer 18 for passivation and physical protection. Polyimide layer 18 typically ranges from five to fifteen microns in thickness.

A key feature of the present invention is to pretreat polyimide layer 18 with an organic base solution, e.g. hydroxyl amine, at an elevated temperature to generate functional chemical groups such as amino-ester and amide that react with underfill encapsulant 16 to form covalent bonds between the polyimide layer and the encapsulant material during the cure cycle. The cure cycle is a heating process that ranges from say two to four hours depending on the temperature, e.g. 100 to 200° C. An encapsulant material is disposed on the pretreated polyimide surface and the resulting assembly is cured to form covalent bonds between the encapsulant material and the polyimide surface that provide improved adhesive properties during subsequent thermal cycling. For example, the epoxy resin in encapsulant 16 effectively reacts during its cure cycle with functional groups such as hydroxyl, amino, and carboxylic acid.

In the prior art, some polyimides can be reversed to polyamic acid on treatment with a strong base such as potassium hydroxide (KOH). However, a strong inorganic KOH base can also react with the interconnects causing damage that could prevent attachment to the substrate or seriously reduce the reliability of the attachment. Any bulky organic group attached to the polyimide layer provides sufficient stearic hindrance to prevent the conversion of polyamic acid to polyimide during soldering processes. Therefore, an organic base reagent that does not react with interconnects and provides sufficient stearic hindrance is needed. In addition, it is desirable to employ a solvent capable of swelling the polyimide layer. The swelling function allows the reagent to more effectively react with the polyimide to form the desired functional groups.

Accordingly, in one embodiment of the present invention, semiconductor die 12 with interconnects 14 and polyimide passivation layer 18 is pretreated by immersing the assembly in a 20% organic base solution, e.g. hydroxyl amine. One example of the hydroxyl amine solution includes a reagent such as 2,(2-aminoethoxy) ethane alcohol, dissolved in a solvent, such as N-methyl pyrrolidione (NMP), at 65° C. for sixty seconds. The solution concentration may range from 10 to 20%, while the temperatures ranges from 50° to 90° C. and the duration from thirty to sixty seconds. The pretreatment results in generation of amino-ester and amide functional groups at the surface of polyimide layer 18. The amino-ester and amide functional groups form covalent bonds with the epoxy groups in the encapsulant material during the cure cycle. Alternately, the hydroxyl amine solution may be disposed onto polyimide layer 18 by spraying, or deposited by vapor deposition. If encapsulant 16 is made of SYCAR, then polyimide surface 18 must also be immersed in a solution of methacryloyl chloride or anhydride, or other monomer containing vinyl group.

Semiconductor die 12 with the treated polyimide layer 18 is attached to substrate 10 by standard DCA methods leaving a gap between the assemblies. Encapsulant 16 is disposed in the gap between semiconductor die 12 and substrate 10 and cured to form the covalent bonds and an environmental seal between the assemblies. Thus, the amino-ester and amide functional groups react with underfill encapsulant 16 to form an adhesion between the treated polyimide layer and epoxy encapsulant with covalent bonds that does not separate during subsequent thermal cycling. The excess reagent and solvent are removed by immersion in sequential dionized water and methanol baths and then dried.

Other hydroxyl amine reagents and solvents may be employed. For example, 2,(N,N-dimethylamino) ethanol is also a suitable reagent, and N,N-dimethyl formamide or γ-butyrolactone are suitable solvents. Specific concentrations, temperatures and duration employed depend on the specific reagent, solvent and the type of polyimide layer. Generally, a solution concentration ranging from 10 to 20% with the temperatures above ambient, for example from 50° to 90° C., and the duration from thirty to sixty seconds is sufficient. The polymer cure temperature depends upon encapsulant material used, but typically a cure temperature of 100° to 140° C. for two to four hours gives the desired results.

In an alternate embodiment, substrate 10 may include a polyimide layer adjacent to encapsulant 16. To create similar covalent bonding, the polyimide layer of substrate 10 is pretreated with the same organic based hydroxyl amine solution. The treated polyimide layer reacts with encapsulant 16 during its cure cycle as described above.

By now it should be appreciated that the present invention provides an adhesive surface by pretreating a polyimide layer of a semiconductor die with a hydroxyl amine solution to form amino-ester and amide functional groups at the surface of the polyimide layer. The semiconductor die is electrically coupled to a substrate with metal interconnects leaving a gap between the assemblies. An underfill encapsulant is introduced between the pretreated polyimide layer and the substrate for bonding and an environmental seal. Covalent bonds are formed between the polyimide layer and underfill encapsulant during the cured cycle because of the pretreatment to the polyimide layer. The pretreatment improves the bonding between the materials and provides a more wettable surface with the epoxy encapsulant formulation.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method of adhesion to a polyimide surface, comprising the step of disposing an organic base solution at a temperature above ambient on the polyimide surface to pretreat the polyimide surface by forming amino-ester and amide groups.

2. The method of claim 1 wherein said organic base solution is a hydroxyl amine solution.

3. The method of claim 2 further including the steps of:
   disposing an encapsulant material on the polyimide surface; and
   curing said encapsulant material to form covalent bonds to the polyimide surface.

4. The method of claim 3 further including the step of heating said hydroxyl amine solution to a range of 50° to 90° C. to form said amino-ester and amide groups on the polyimide surface which form said covalent bonds with said encapsulant material.

5. The method of claim 4 wherein said hydroxyl amine solution includes one of a reagent group of 2,(2-aminoethoxy) ethane alcohol, and 2,(N,N-dimethylamino ethoxy) ethanol.

6. The method of claim 5 wherein said hydroxyl amine solution further includes one of a solvent group of N-methyl pyrrolidione, N,N-dimethyl formamide, and γ-butyrolactone.

7. The method of claim 6 wherein said step of disposing said hydroxyl amine solution includes the step of immersing the polyimide surface into said hydroxyl amine solution.

8. The method of claim 6 wherein said step of disposing said hydroxyl amine solution includes the step of spraying said hydroxyl amine solution onto the polyimide surface.

9. The method of claim 6 wherein said step of disposing said hydroxyl amine solution includes the step of depositing said hydroxyl amine solution onto the polyimide surface by vapor deposition.

10. A method of adhesion to a polyimide surface, comprising the steps of:
    disposing a hydroxyl amine solution at a temperature above ambient on the polyimide surface to pretreat the polyimide surface by forming amino-ester and amide groups;
    disposing an epoxy material on the polyimide surface; and
    curing said epoxy material to form covalent bonds to the polyimide surface.

11. The method of claim 10 further including the step of heating said hydroxyl amine solution to a range of 50° to 90° C. to form said amino-ester and amide groups on the polyimide surface which form said covalent bonds with said epoxy material.

12. The method of claim 11 wherein said hydroxyl amine solution includes one of a reagent group of 2,(2-aminoethoxy) ethane alcohol, and 2,(N,N-dimethylamino ethoxy) ethanol.

13. The method of claim 12 wherein said hydroxyl amine solution further includes one of a solvent group of N-methyl pyrrolidione, N,N-dimethyl formamide, and γ-butyrolactone.

14. The method of claim 13 wherein said step of disposing said hydroxyl amine solution includes the step of immersing the polyimide surface into said hydroxyl amine solution.

15. The method of claim 13 wherein said step of disposing said hydroxyl amine solution includes the step of spraying said hydroxyl amine solution onto the polyimide surface.

16. The method of claim 13 wherein said step of disposing said hydroxyl amine solution includes the step of depositing said hydroxyl amine solution onto the polyimide surface by vapor deposition.

* * * * *